United States Patent
Chin et al.

(10) Patent No.: US 7,871,289 B2
(45) Date of Patent: Jan. 18, 2011

(54) PRINTED CIRCUIT CABLE ASSEMBLY FOR TOP DOWN INSTALLATION

(75) Inventors: Cheng Siong Chin, Singapore (SG); Wai Onn Chee, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 240 days.

(21) Appl. No.: 12/167,051

(22) Filed: Jul. 2, 2008

(65) Prior Publication Data
US 2009/0009912 A1 Jan. 8, 2009

Related U.S. Application Data

(60) Provisional application No. 60/958,547, filed on Jul. 6, 2007.

(51) Int. Cl.
*G11B 5/55* (2006.01)
(52) U.S. Cl. .................. 439/496; 439/67; 174/250; 360/265.1; 360/264
(58) Field of Classification Search .............. 439/496, 439/67; 174/250; 360/265.1, 264
See application file for complete search history.

(56) References Cited

U.S. PATENT DOCUMENTS

| | | | |
|---|---|---|---|
| 6,129,579 A | 10/2000 | Cox et al. | |
| 6,288,879 B1 | 9/2001 | Misso et al. | |
| 6,543,124 B2 | 4/2003 | Eckerd et al. | |
| 6,654,208 B2 | 11/2003 | Hong et al. | |
| 6,680,823 B2 | 1/2004 | Wood et al. | |
| 6,856,490 B2 | 2/2005 | Rosner et al. | |
| 6,954,328 B2 | 10/2005 | Daniel et al. | |
| 6,970,329 B1 | 11/2005 | Oveyssi et al. | |
| 7,082,012 B2 | 7/2006 | Macpherson et al. | |
| 7,445,496 B2 * | 11/2008 | Kao | 439/496 |
| 7,481,669 B1 * | 1/2009 | Lee | 439/496 |

* cited by examiner

*Primary Examiner*—Gary F. Paumen
(74) *Attorney, Agent, or Firm*—Fellers, Snider, et al.

(57) ABSTRACT

A printed circuit cable assembly for top down installation in a disc drive or the like in which a printed circuit cable supporting electrical conductor paths has a body portion, a flex portion and an insertion tab connecting the body portion and flex portion. A PCC support member having a support ramp extending into a slotted gap supports the printed circuit cable with the insertion tab extending into the slotted gap so that the flex portion is extended for attachment to a moveable article, such as the head stack assembly of a disc drive. Preferably, the PCC support member has an indexing bore, and the PCC support member with the supported printed circuit cable is mounted to a support member having an indexing post, the PCC support member positioned so that indexing bore is positioned over the indexing post.

20 Claims, 6 Drawing Sheets

PRINTED CIRCUIT CABLE ASSEMBLY FOR TOP DOWN INSTALLATION

RELATED APPLICATIONS

The present application makes a claim of domestic priority to U.S. Provisional Patent Application No. 60/958,547 filed Jul. 6, 2007, which is hereby incorporated by reference.

BACKGROUND

Data storage devices store and retrieve large amounts of computerized data in a fast and efficient manner. Such devices may include one or more data storage discs that are rotated by a spindle motor at a constant high speed. Data transfers with tracks on the discs are carried out using a rotary actuator assembly (also referred to as a head stack assembly, or HSA). The HSA supports a corresponding number of data transducing heads that are controllably moved across the disc surfaces by an actuator motor (also referred to as a voice coil motor, or VCM).

The spindle motor and the HSA are typically mounted to a base deck that cooperates with a top cover to provide a protected interior environment for the discs and heads. A printed circuit cable (PCC) provides the requisite electrical communication paths between the HSA and a disc drive printed circuit board (PCB) mounted to the exterior of the base deck. The disc drive PCB supports communication and control electronics for operation and control of the disc drive.

The printed circuit cable (PCC) includes a flex cable that has a flexible, laminated member that electrically isolates and supports a number of embedded electrical conduction paths (conductors) along the length of the laminated member. One end of the flex cable is supported by a flex cable support (also referred to as a flex cable clamp) that is mounted on the base deck; the distal end of the flex cable is attached to the HSA. Typically, a bulkhead connector extends through the base deck to facilitate electrical connection from the flex cable support to the disc drive PCB.

The intermediary portion of the flex cable between the flex cable support and the HSA is a dynamic slack loop that provides strain relief while the HSA moves the heads across the full radius of the disc surfaces. In practice, the flex cable loop acts as a spring that exerts undesired bias force on the HSA as the heads are moved to different radial positions with respect to the disc surfaces. This bias force tends to nominally urge the heads away from the desired position over a selected track, so this bias force must be within a range that is compensated by servo control circuitry of the drive to assure that the disc drive operates predictably.

A disc drive design must provide printed circuit cable (PCC) configurations with controllable and repeatable flex cable dynamic loop characteristics over the desired range of HSA motion. Furthermore, there is a continuing trend to improve not only disc drive operational characteristics, but also to improve disc drive manufacturing processes. Top down assembly (unidirectional positioning and installation of components in the disc drive) has become the ultimate goal in creating low cost disc drives. It is to such improvements that the claimed invention is directed.

SUMMARY

In accordance with preferred embodiments, a printed circuit cable assembly for top down installation in a disc drive or the like in which a printed circuit cable supporting electrical conductor paths has a body portion, a flex portion and an insertion tab connecting the body portion and flex portion. A PCC support member having a support ramp and a slotted gap supports the printed circuit cable with the insertion tab extending into the slotted gap so that the flex portion is extended for attachment to a moveable article, such as but not limited to the head stack assembly of a disc drive.

Preferably, the PCC support member has an indexing bore and a support member, such as the base deck of a disc drive, has an indexing post. The PCC support member with the supported printed circuit cable is mounted to the support member such that the indexing bore is positioned over the indexing post.

These and various other features and advantages which characterize the claimed invention will become apparent upon reading the following detailed description and upon reviewing the associated drawings.

DESCRIPTION

Figure 1:
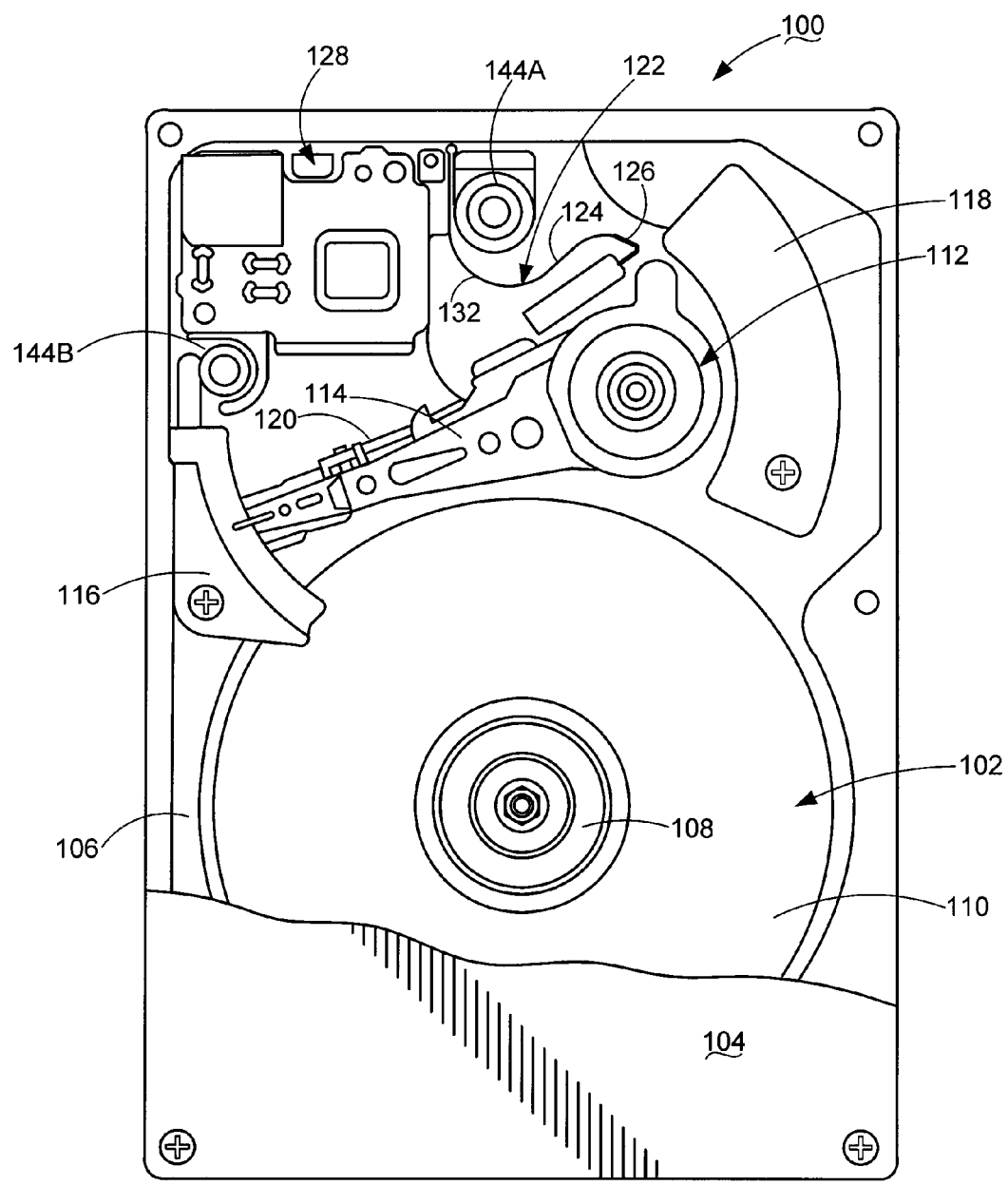
FIG. 1 is a plan view of a disc drive constructed in accordance with preferred embodiments of the present invention, the cover member being partially cutaway.

A detailed description of the various presently preferred embodiments of the present invention will commence with reference to FIG. 1. Shown therein is a data storage device 100 that includes a head-disc assembly (HDA) 102 and a printed circuit board (PCB). Although not viewable in FIG. 1, it will be understood that the PCB serves to control operation of the HDA 102.

A top cover 104, partially cutaway in FIG. 1, mates with a base deck 106 to provide an environmentally controlled environment for the HDA 102. A spindle motor 108 rotates one or more magnetic recording discs 110 at a constant, high speed. A rotary actuator assembly 112, or head stack assembly (HSA), has a number of actuator arms 114 that support data transducing heads (not shown) in near proximity to the surfaces of the discs 110. In FIG. 1, the HDA 102 is depicted with the actuator arms parked away from the discs 110 on a parking ramp 116.

The actuator arms 114 move the data transducing heads across the surfaces of the discs 110 through application of current to the coil of a voice coil motor (VCM) 118. Flex on suspension (FOS) conductors 120 are routed from the heads 112 along the actuator arms 114 to accommodate data write and read signals to and from the data transducing heads.

A printed circuit cable assembly 122, also referred to herein as the PCC assembly 122, facilitates electrical communication between the HSA 102 and the printed circuit board (PCB) on the underside of the base deck 106. The PCB will be understood to be of a conventional configuration to support the requisite communication and control electronics for the disc drive 100.

The PCC assembly 122 includes a flexible, ribbon-like laminated flex PCC portion 124 that electrically isolates and supports a number of embedded electrical conductor paths along its length. A proximal end of the flex PCC portion 124 is attached to a PCC clamp 126 that is affixed to the HDA 112 for electrical communication therewith.

The distal portion of the printed circuit cable (PCC) 122 is supported on and attached to a printed circuit cable support member 128, or PCC support member, that is also shown in FIGS. 2-5. A bulkhead connector 130 (see FIG. 3) extends under the PCC support member 128 to communicate through the base deck 106 and facilitate electrical connection with the underlying disc drive PCB in a conventional manner.

The flex PCC portion 124 has a dynamic printed circuit loop 132 (also referred to as the PCC loop) that extends between the PCC clamp 126 (affixed to the HSA 112) and the portion of the PCC assembly 122 that is mounted on the PCC support 128. The PCC loop 132 is a slack loop that allows the HSA 110 to rotate the actuator arms 114 to position the data transducing heads along their full radial path over the discs 110.

Figure 2:
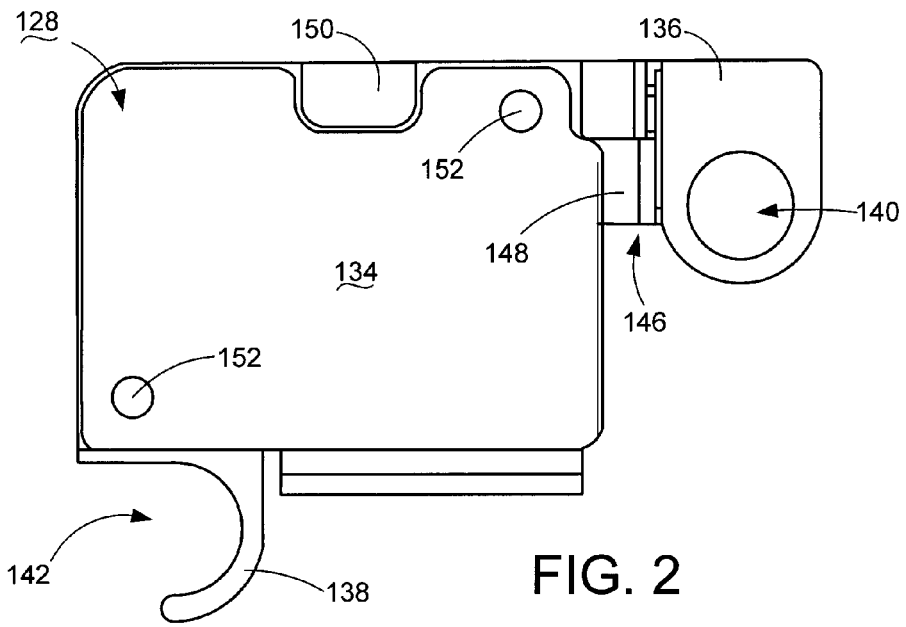
FIG. 2 is a top plan view of a flex cable support of the disc drive of FIG. 1.

Turning to FIG. 2, the PCC support 128 has a generally planar shaped body portion 134 with a protrusion member 136 at one end and a hook member 138 along one edge. The protrusion member 136 has an indexing bore 140, and the hook member 138 forms an indexing cavity 142. Returning to FIG. 1, it will be noted that a pair of cylindrically shaped guide posts 144A and 144B are mounted to the base deck 106 by bolts extending through central bores in the guide posts 144A, 144B that attach to threaded bores in the base plate 106.

The outer diameter of the guide post 144A is determined to be received in the indexing bore 140 of the protrusion member 136; and the outer diameter of the guide post 144B is determined to be received in the indexing cavity 142 of the hook member 138. The PCC support member 128 is mounted to the base deck 106 by positioning the PCC support member so that the indexing bore 140 of the protrusion member 136 and the indexing cavity 142 of the hook member 138 engage and receive the guide posts 144A, 144B, respectively.

Figure 3:
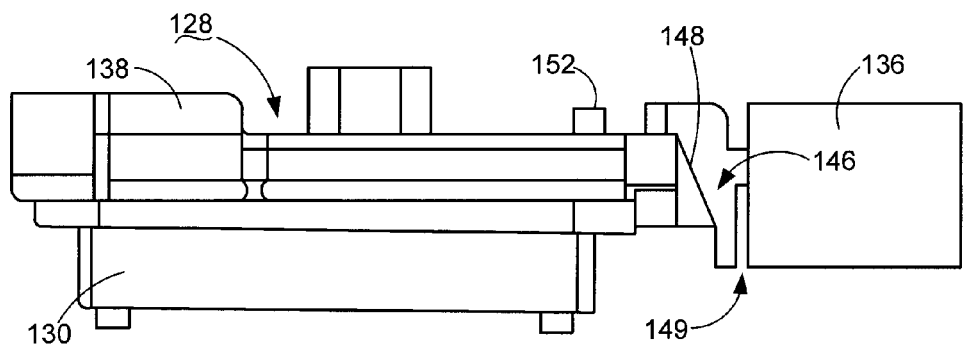
FIG. 3 is a side elevational view of the flex cable support of FIG. 2.
Figure 3A:
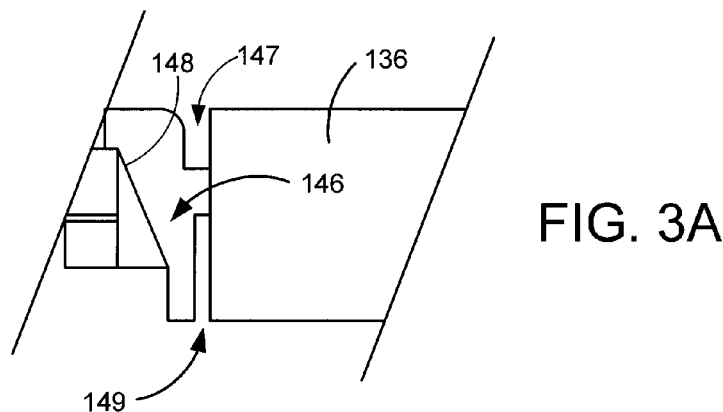
FIG. 3A is an enlarged view of a portion of the flex cable support of FIG. 2.

The PCC support 128 has a gap 146 between the end of the body portion 134 and the protrusion member 136, and a ramp 148 extends downwardly from the body portion 134 into this gap. As shown in FIG. 3, the ramp 148 extends to partially fill the gap 146, leaving the bottom of the gap 146 open, as may best be seen in the enlarged partial view of FIG. 3A. A slide plate slot 149 extends along the protrusion member 136 and to communicate from the gap 146 to the back of the PCC support member 128.

Returning to FIG. 2, extending upward from the body portion 134 are a gripping member 150 and a pair of indexing posts 152. The gripping member 150 serves as a handle for guiding and positioning the PCC support 128 onto the base plate 106, and the indexing posts 152 serve to accept and retain the flex PCC portion 124 on the body 134.

Figure 4:
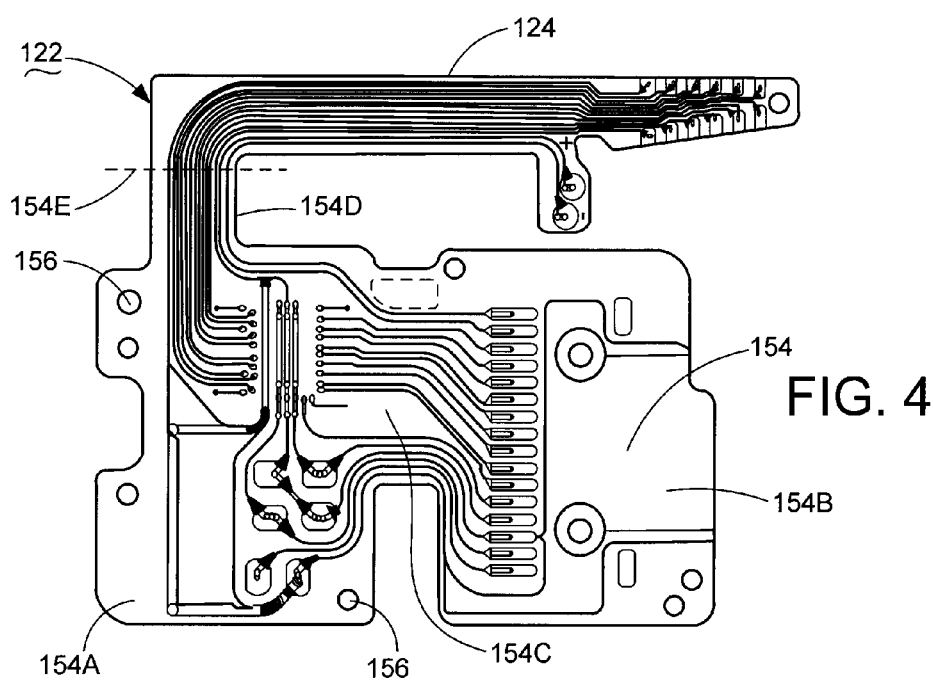
FIG. 4 is a top plan view of the flex cable of the disc drive of FIG. 1.

The PCC assembly 122, as shown in FIG. 4, is a flat, multi-layered member that is sufficiently flexible for wrap around assembly to the PCC support member 128; the construction of the PCC assembly 122 is generally conventional, having a cover layer, a layer of adhesive, a copper trace layer (the electrical conductors), another layer of adhesive, and a base layer. The copper trace layer forms a portion of the electronic circuitry of the disc drive 100, the PCC cable 122 facilitating electrical communication between the PCB beneath the base deck 106 and the HSA 102. A description of the circuitry of the PCC assembly 122 is not necessary for the present disclosure, other than to note that the PCC assembly 122, as well as the PCB support the requisite communication and control electronics for the disc drive 100.

The PCC assembly 122 has a body portion 154 from which the flex PCC portion 124 extends. The body portion 154 has a pair of indexing holes 156 that are spatially positioned to be engaged over the indexing posts 152 on the PCC support member 128. As shown, the body portion 154 has a number of other hole connectors and tab connectors that conventionally establish the required electrical communication.

Figure 5:
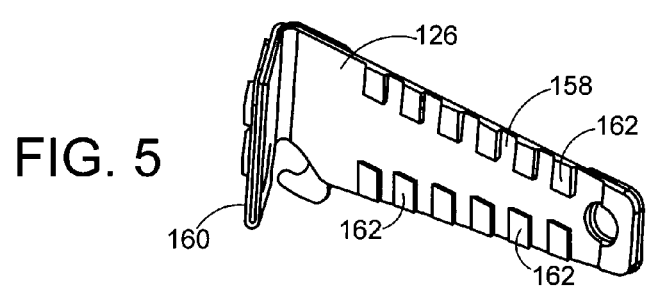
FIG. 5 is a flex cable connector that attaches the flex cable to the head stack assembly.

The proximal end of the flex PCC portion 124 is attached to the HSA 112 by means of the PCC clamp 126, which is also shown in FIG. 5. The PCC clamp 26 has a base portion 158 that is adhered to the PCC portion 124 and an angled leg portion 160. The base portion 158 has a number of connector tabs 162 to which electrical conductors of the flex PCC portion 124 are electrically secured, and the connector tabs 162 are electrically connected with solder land areas on the leg portion 160 that are soldered to appropriately disposed electrical connectors on the HSA 112.

For convenience of reference, the PCC body 154 has a top body portion 154A, a bottom body portion 154B and a hinge body portion 154C extending between the top and bottom body portions 154A, 154B. Further, the PCC body 154 has an insertion tab 154D that extends between the top bottom portion 154A and the flex PCC portion 124. As shown, the flex PCC portion 124 extends angularly from the insertion tab 154D, preferably at about a ninety degree angle. The flex PCC portion 124 is bendable relative to the insertion tab 154D along a bend line 154E.

Figure 6:
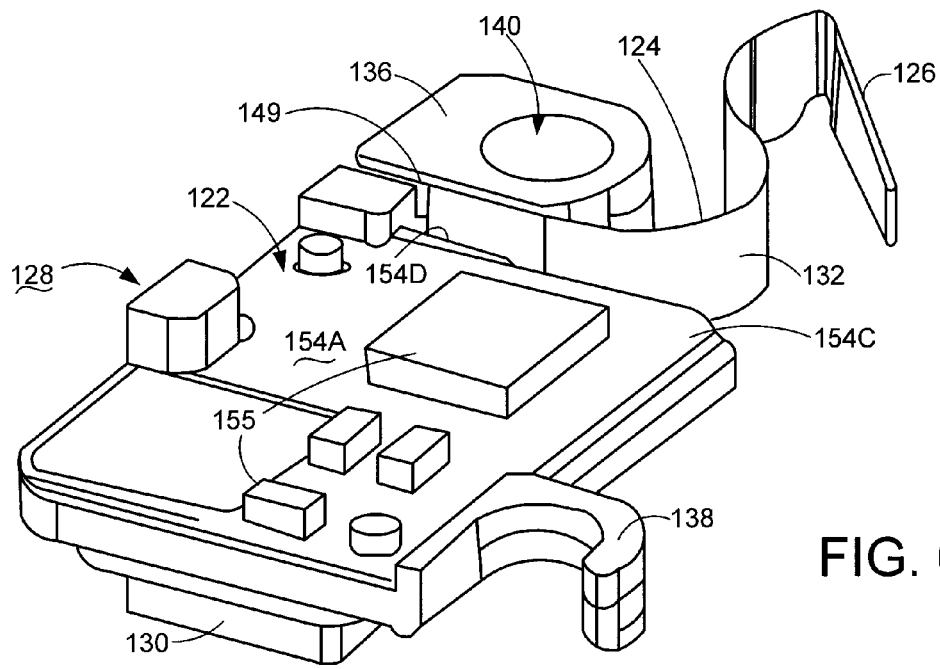
FIG. 6 is a top corner perspective view of the flex cable support of FIG. 2 with the flex cable supported thereon.
Figure 7:
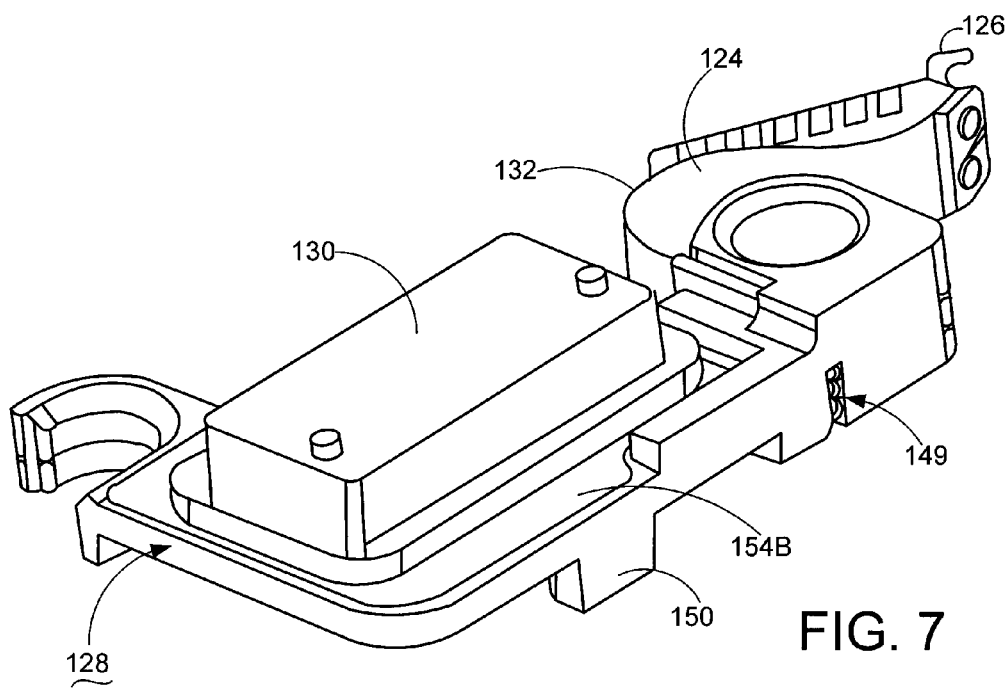
FIG. 7 is a bottom corner perspective view to the flex cable support of FIG. 2 with the bulkhead connector attached thereto.
Figure 8:
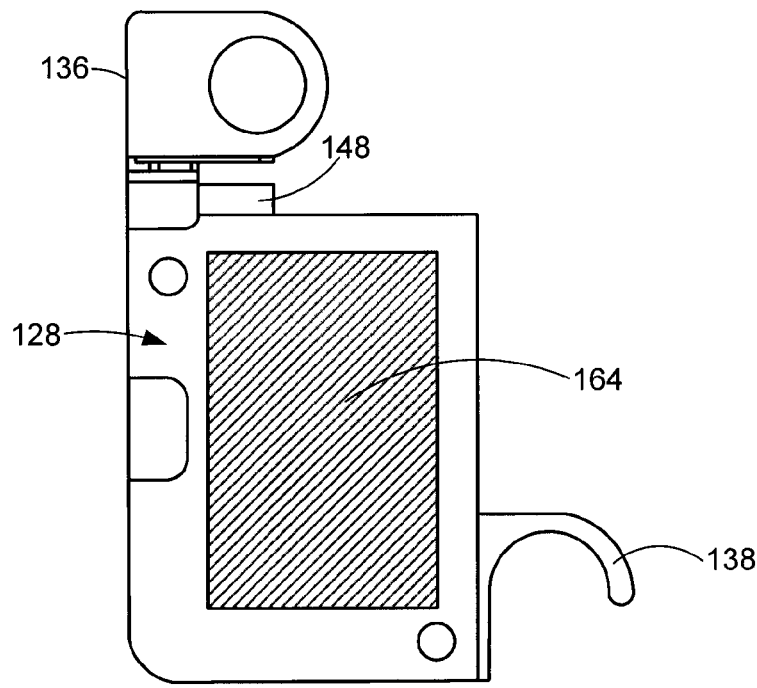
FIG. 8 is a top plan view of the flex cable support showing the area of adhesive application.

FIGS. 6 and 7 show the printed circuit cable, or PCC, 122 assembled to the PCC support 128, along with several typical electrical components 155. The body portion 154 is folded at the hinge portion 154C and the top body portion 154A positioned on the top surface of the PCC support member 128 with the indexing holes 156 positioned over the indexing posts 152. The bottom body portion 154B is positioned on the bottom surface of the PCC support 128 with the connector 130 mounted thereon. FIG. 8 shows the placement of PSA (pressure sensitive adhesive) tape on area 164, and a similar area for the placement of PSA tape is provided on the opposing side of the PCC support member 128.

Figure 9:
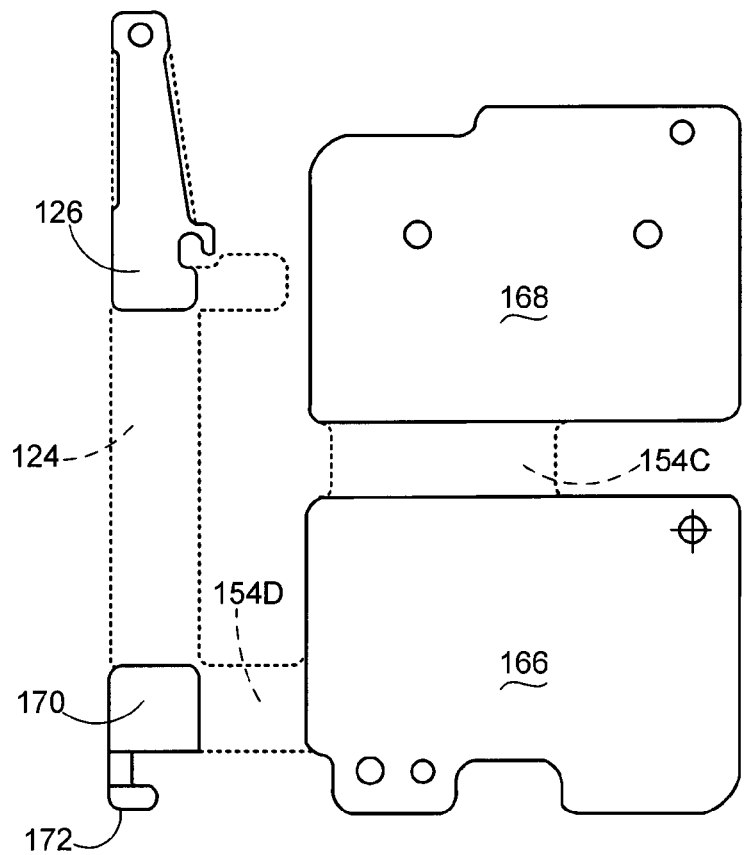
FIG. 9 shows plan views of the stiffener members for the printed circuit cable.

FIG. 9 shows a stiffener plate 166 and a stiffener plate 168 that are shaped to be adhered to the base layer of the PCC assembly 122 on the top and bottom body portions 154A, 154B, respectively, with an adhesive. Also shown is a stiffener plate 170 that is shaped to be adhered via adhesive to the base layer of the PCC assembly 122 at the intersection of the flex PCC portion 124 and the insertion tab 154D. It will be noted that the stiffener plate 170 has a hook portion 172 that extends from the distal end of the flex PCC portion 122 at the intersection thereof with the insertion tab 154D.

The stiffener plate 166, the stiffener plate 168 and the stiffener plate 170, together with the PCC clamp 126, are depicted in FIG. 9 relative to the underlying portions of the PCC assembly 122 (in dashed line outline) when adhered to the base layer thereof, and showing the location of these stiffeners.

Figure 10:
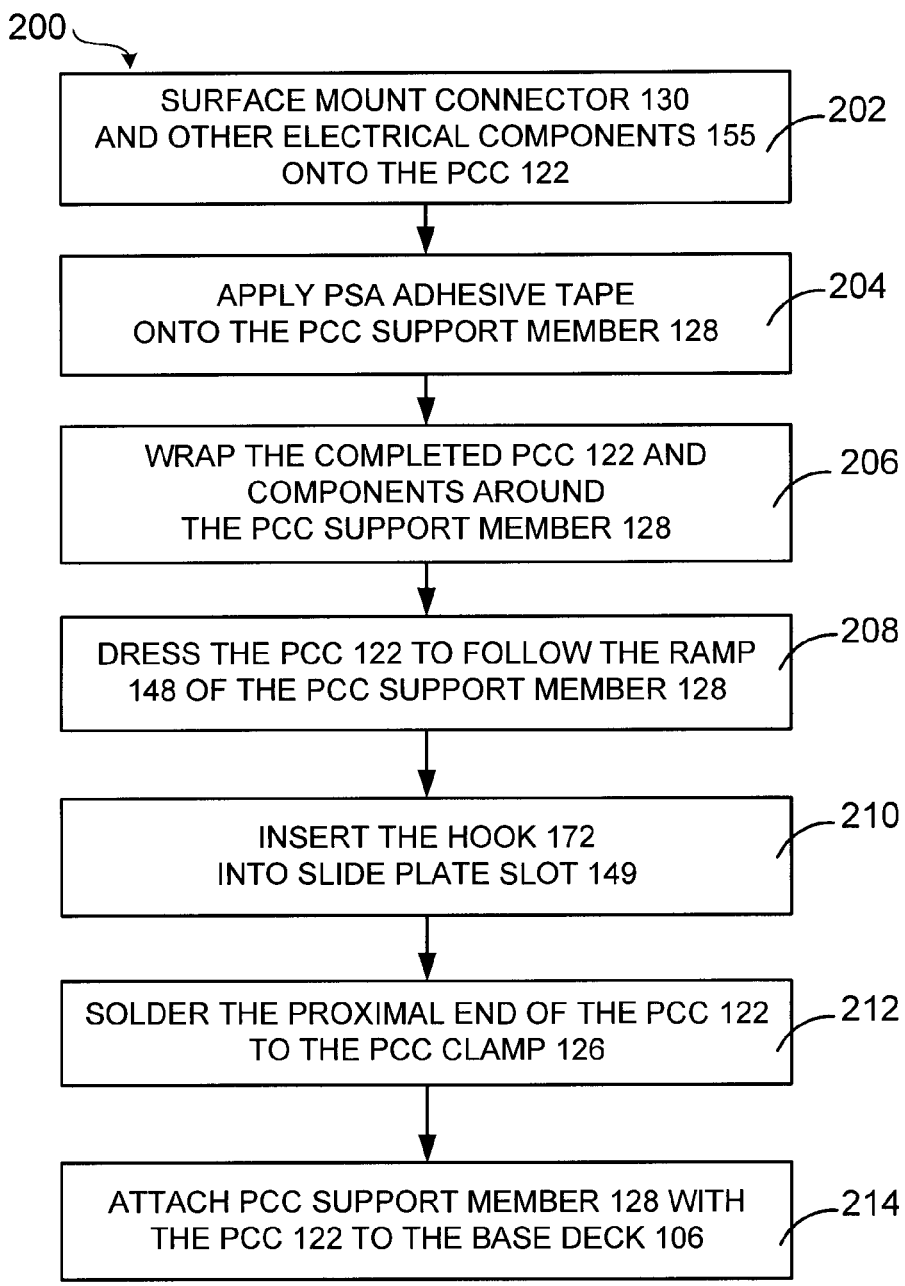
FIG. 10 is a diagram of the steps for the top down installation of the PCC cable assembly.

FIG. 10 shows a flow chart for a routine 200 to show a preferred manner in which the printed circuit cable 122 is assembled. Initially, at step 202, various components are preferably surface mounted to the PCC assembly 122, including the connector 130, the electrical components 155, the stiffener plates 166, 168, 170 and the PCC clamp 126. At step 204, double sided PSA tape is preferably applied onto the area 164 on both sides of the PCC support member 128. With the PSA tape in place, the completed PCC assembly 122 (with mounted components) is wrapped around the PCC support member 128, as shown by step 206.

The PCC assembly 122 is dressed during step 208 so that the insertion tab 154D follows the ramp 148 of the PCC support member 128. At step 210, the hook portion 172 is inserted into the slide plate slot 149 in the PCC support member 128. Step 212 sets forth soldering the proximal end of the flex PCC portion 124 to the head stack assembly (HSA) 112 to the PCC clamp 126.

At this point, the HSA 112 will now be assembled to the base deck 106, but it will be understood that the HSA 112 can be installed prior to the assembly 200 of the PCC assembly 122. The final step 214 is the placement of the PCC support member 128, with the PCC assembly 122 and components mounted thereon, on the base plate 106 with the indexing bore 140 over the guide post 144A and the indexing cavity 142 engaging the guide post 144B.

While the various embodiments presented herein are generally provided in the context of a data storage device, it will be appreciated that this is merely for purposes of illustration and is not limiting. Rather, the exemplary printed circuit assembly as disclosed herein can be readily used in any number of other environments as desired.

It will be clear that the various embodiments presented herein are well adapted to carry out the objects and attain the ends and advantages mentioned as well as those inherent therein. While presently preferred embodiments have been described for purposes of this disclosure, numerous changes may be made that will readily suggest themselves to those skilled in the art and that are encompassed in the spirit of the invention disclosed and as defined in the appended claims.

We claim:

1. An apparatus comprising:
  a printed circuit cable supporting electrical conductor paths and having a body portion, a flex portion and an insertion tab connecting the body portion and flex portion, the insertion tab supporting a tab stiffener plate with a hook portion; and
  a PCC support member having a support ramp and a slotted gap, the printed circuit cable supported by the PCC support member with the insertion tab supported by the support ramp to extend the hook portion into the slotted gap so that the flex portion is supported for attachment to a moveable article.

2. The apparatus of claim 1 further comprising:
  an indexing post supported by a base; and
  wherein the PCC support member has an indexing bore, the PCC support member supportable on the base with the indexing post received in the indexing bore.

3. The apparatus of claim 1 wherein the flex portion is foldable at the insertion tab so that the insertion hook is disposable in the slot of the gap.

4. The apparatus of claim 1 wherein the body portion of the PCC circuit cable has first body portion, a second body portion and a hinge body portion, and wherein the PCC circuit cable is extended about the PCC support member with the first and second body portions supported on opposing sides of the PCC support member, the hinge portion extending around an edge of the PCC support member.

5. The apparatus of claim 1 wherein the printed circuit cable further comprises first and second body stiffener plates adhered to opposing sides of the PCC support member.

6. The apparatus of claim 1 further comprising:
  a PCC clamp supported by one end of the flex portion, the PCC clamp attachable to the moveable article.

7. The apparatus of claim 1 further comprising:
  at least one electrical component supported by the printed circuit cable.

8. A printed circuit cable assembly comprising:
  a printed circuit cable supporting electrical conductor paths and having a body portion, a flex portion and an insertion tab connecting the body portion and flex portion; and
  a PCC support member having a body portion, a protrusion member having an indexing bore and a hook member forming an indexing cavity, the body portion having a top surface and a support ramp extending from the top surface into a gap between the body portion and the protrusion member;
  wherein the body portion of the printed circuit cable is attached to the upper surface of the body portion of the PCC support member, the insertion tab at least partially supported by the support ramp and extensive into the gap; and
  wherein the flex portion extends for attachment to a moveable article.

9. The assembly of claim 8 further comprising first and second indexing posts supported by a base, wherein the PCC support member is supportable on the base with the first indexing post received in the indexing bore and the second indexing post received in the indexing cavity.

10. The assembly of claim 8 wherein the printed circuit cable has a base layer and a cover layer, the printed circuit having a first stiffener plate supported on the base layer on the insertion tab, the flex portion foldable on the insertion tab so that the insertion tab is disposable in the gap between the support ramp and the protrusion member.

11. The assembly of claim 10 wherein the PCC support member has a slide plate slot communicating with the gap, and wherein the first stiffener plate has a hook portion that is receivable in the slide plate slot.

12. The assembly of claim 8 wherein the body portion of the PCC circuit cable has top body portion, a bottom body portion and a hinge body portion, and wherein the PCC circuit cable is extendable about the PCC support member so that the top body portion and the bottom portions are supported on opposing sides of the PCC support member with the hinge portion extending therebetween.

13. The assembly of claim 10 wherein the printed circuit cable further comprising a second stiffener plate supported by the top body portion and a third stiffener plate supported by the bottom body portion, the second and third stiffener plates adhered to opposing sides of the PCC support member.

14. The assembly of claim 8 further comprising:
  a PCC clamp supported by one end of the flex portion, the PCC clamp attachable to the moveable article.

15. The assembly of claim 8 further comprising:
  at least one electrical component supported by the printed circuit cable.

16. An assembly method comprising the steps of:
  wrapping a flexible printed circuit cable to a PCC support member having a ramp member extending into a slotted gap, the printed circuit cable supporting electrical conductor paths and having a body portion, a flex PCC portion and an insertion tab connecting the body portion and flex portion, the insertion tab supporting a tab stiffener plate with a hook portion;

shaping the printed circuit cable to the PCC support member so that the insertion tab follows the ramp member and extends the hook portion into the slotted gap, the flex PCC portion extending there from;

attaching the flex PCC portion to a moveable article;

mounting the PCC support member and supported printed circuit cable to a support member.

17. The assembly method of claim 16 further comprising:

adhering the printed circuit cable to the PCC support member.

18. The assembly method of claim 16 wherein the printed circuit cable has a body portion, the method further comprising the steps of:

adhering stiffener plates to the body portion of the printed circuit cable; and adhering the stiffener plates to opposing sides of the PCC support member.

19. The assembly method of claim 16 wherein the printed circuit cable has a tab portion between the body and flex portions, the method further comprising the steps of:

adhering a stiffener plate having a hook to the tab portion; and positioning the hook in the slot of the slotted gap during the shaping step.

20. The assembly method of claim 16 wherein the printed circuit cable has electrical conductor paths extending along the body, tab and flex PCC portions, and wherein the step of attaching the flex PCC portion to a moveable article comprises the steps of:

adhering the end of the flex PCC portion to a PCC clamp having electrical contact pads;

connecting the electrical conductors to the contact pads of the PCC clamp; and soldering the PCC clamp to the moveable article.

* * * * *